(12) United States Patent
Kohlscheen

(10) Patent No.: US 9,822,438 B2
(45) Date of Patent: Nov. 21, 2017

(54) COATED CUTTING TOOL AND METHOD FOR THE PRODUCTION THEREOF

(71) Applicant: Kennametal Inc., Latrobe, PA (US)

(72) Inventor: Joern Kohlscheen, Bremen (DE)

(73) Assignee: KENNAMETAL INC., Latrobe, PA (US)

( * ) Notice: Subject to any disclaimer, the term of this patent is extended or adjusted under 35 U.S.C. 154(b) by 129 days.

(21) Appl. No.: 14/672,515

(22) Filed: Mar. 30, 2015

(65) Prior Publication Data

US 2015/0284837 A1 Oct. 8, 2015

(30) Foreign Application Priority Data

Apr. 2, 2014 (DE) .................. 10 2014 104 672

(51) Int. Cl.
| | | |
|---|---|---|
| C23C 14/06 | (2006.01) | |
| C23C 14/00 | (2006.01) | |
| C23C 14/08 | (2006.01) | |
| C23C 14/34 | (2006.01) | |
| C23C 28/04 | (2006.01) | |

(52) U.S. Cl.
CPC ...... *C23C 14/0036* (2013.01); *C23C 14/0057* (2013.01); *C23C 14/0676* (2013.01); *C23C 14/08* (2013.01); *C23C 14/3485* (2013.01); *C23C 28/042* (2013.01); *C23C 28/044* (2013.01)

(58) Field of Classification Search
USPC .......... 51/307, 309; 428/336, 697, 698, 699, 428/701, 702
See application file for complete search history.

(56) References Cited

U.S. PATENT DOCUMENTS

| | | | | |
|---|---|---|---|---|
| 5,447,804 A * | 9/1995 | Schulz | .............. | C23C 14/08 428/702 |
| 7,147,939 B2 * | 12/2006 | Henderer | .............. | B23G 5/06 428/701 |
| 8,119,227 B2 * | 2/2012 | Reineck | .............. | C23C 30/005 428/336 |
| 8,129,040 B2 * | 3/2012 | Quinto | .............. | C23C 30/005 428/697 |
| 2008/0193782 A1 * | 8/2008 | Ramm | .............. | C23C 14/024 428/469 |
| 2009/0269600 A1 * | 10/2009 | Ramm | .............. | C22C 1/0416 428/698 |
| 2010/0183884 A1 | 7/2010 | Schier | | |
| 2010/0183900 A1 | 7/2010 | Wallin et al. | | |
| 2011/0268514 A1 | 11/2011 | Schier et al. | | |

FOREIGN PATENT DOCUMENTS

| | | | |
|---|---|---|---|
| CA | 2 059 532 C | | 10/2002 |
| CA | 2601722 | * | 9/2006 |
| CA | 2665044 | * | 4/2008 |
| CN | 1888139 | * | 1/2007 |
| DE | 195 18 779 C1 | | 7/1996 |
| EP | 1 097 250 B1 | | 11/2005 |
| EP | 1 717 346 A2 | | 11/2006 |
| EP | 1 762 637 A2 | | 3/2007 |
| EP | 1 762 638 A2 | | 3/2007 |
| WO | 2004/029321 | * | 4/2004 |

* cited by examiner

*Primary Examiner* — Archene Turner
(74) *Attorney, Agent, or Firm* — Larry R. Meenan

(57) ABSTRACT

The invention relates to a method for producing a coated cutting tool in which a coating with at least one oxide layer is applied to a base layer by means of a PVD method. The method includes voltage-pulsed sputtering of at least one cathode metal selected from the group of aluminum, scandium, yttrium, silicon, zinc, titanium, zirconium, hafnium, chromium, niobium, and tantalum, as well as mixtures and alloys thereof in the presence of a reactive gas; and the depositing of at least one oxide layer formed by converting the reactive gas with the sputtered cathode metal onto the base body. The cathode metal includes at least aluminum. Dinitrogen oxide is used as the reactive gas. The at least one oxide layer is in the form of an oxide, mixed oxide, or oxide mixture of the at least one cathode metal.

21 Claims, No Drawings

COATED CUTTING TOOL AND METHOD FOR THE PRODUCTION THEREOF

CLAIM TO PRIORITY

This application claims priority from German Application No. 102014104672.2 filed Apr. 2, 2014, the entire contents of which is incorporated herein by reference.

The invention relates to a method for producing a coated cutting tool with a base body and a coating applied to the base body by means of a sputter process. Furthermore, the invention relates to a cutting tool, which can be obtained through a method according to the invention, as well as use of the cutting tool for machining metals and metal alloys insert.

Cutting tools used for machining metals and metal alloys, such as steel and cast iron, typically consist of a base body and a coating applied to the base body, which may comprise one or more layers made of hard materials such as titanium nitride, titanium carbide, titanium carbon nitride, titanium aluminum nitride, and/or aluminum oxide. The coating is used to make the cutting insert harder and/or more wear-resistant and to improve the cutting properties. The CVD method (Chemical Vapor Deposition) and the PVD method (Physical Vapor Deposition) are used to apply the coating.

Arc evaporation (arc-PVD) and cathode sputtering are particularly known as PVD methods. During sputtering, atoms are ejected from a cathode metal (target) due to bombardment of the target by energetic ions from a plasma and then deposited onto a substrate arranged in the vicinity of the target. In the presence of a reactive gas, conversion products from the target atoms and the reactive gas then form on the substrate. An inert gas such as argon is usually used as the sputtering gas to generate the plasma.

The PVD methods are typically used to deposit titanium nitride and titanium aluminum nitride. The adding of aluminum increases the hardness and oxidation-resistance of the titanium nitride coatings. The use of titanium-free coatings, such as AlZrN, which may be enriched with additional chemical elements such as silicon to improve the coating properties, is also known.

The coating of cutting tools with aluminum oxide is typically done using CVD methods. Aluminum oxide has very good oxidation-resistance and usually exhibits high red hardness and low thermal conductivity. Therefore, cutting tools having coatings made of aluminum oxide are very well-suited for dry machining and/or for processing special alloys such as alloys from titanium and/or nickel. To improve the adherence of the aluminum oxide coating to the base body of the cutting tool, a titanium aluminum nitride base coating can be used.

PVD methods for depositing hard aluminum oxide coatings have only been known about for a few years. These PVD methods require the use of voltage-pulsed cathodes in order to prevent contamination of the metal target from the non-electrically-conducting aluminum oxide. Such type of method is known, for example, from DE 195 18 779 C1. According to this method, two magnetron atomization sources with aluminum targets are connected to a sine-wave generator in order to generate the aluminum oxide coating such that the two atomization sources with a pulse change frequency of between 20 and 100 kHz act alternatively as the anode and cathode of the sputtering arrangement.

With the sputtering method known from DE 195 18 779 C1, pure oxygen is used as the reactive gas. The use of pure oxygen as the reactive gas may lead to population of the targets with oxide coatings and thus to flashovers and process instabilities, despite the voltage-pulsed operation of the metal cathodes. Therefore, the so-called operating point of the coating system is determined when depositing aluminum oxide through sputtering. The operating point is understood to be the flow of oxygen that is still yet permitted before population of the targets of oxide coatings and the associated drastic reduction in the coating rate occurs. The determination of the operating point requires specification of at least one control variable to control the flow rate of the reactive gas during coating.

US 2010/0183900 A1 discloses the use of a high-performance impulse magnetron sputtering device (HIP-IMS), which can be used to prevent the oxide population of the target surface. According to this method, an HIP-IMS discharge with a power density of greater than 200 W/cm$^2$, a pulse duration of up to 100 μsec, and a repetition frequency of 100 Hz is implemented at one or more cathodes. A mixture of argon and oxygen as well as optionally nitrogen and hydrocarbons is used as the reactive gas.

EP 1 097 250 B1 describes the depositing of coatings comprising γ-aluminum oxide through bipolar-pulsed dual magnetron sputtering, during which the reactive gas flow is adjusted such that the impedance of the magnetron discharge is between 150% and 250% of the impedance of a discharge between target electrodes covered completely with oxide.

CA 2059532 relates to the production of transparent oxide coatings on a substrate, particularly of coatings comprising titanium oxide and zinc oxide. The production of oxide coatings takes place through reactive sputtering during direct current operation while using dinitrogen oxide as a component of the reactive gas. The creation of hard coatings for applications in the area of metal machining is not disclosed.

EP 1 762 638 A2 and EP 1 762 637 A2 disclose multilayer coatings, which are applied to a hard metal substrate using PVD methods. The coatings have a base layer comprising titanium aluminum nitride, a PVD aluminum oxide coating over it, a multilayer coating comprising alternating layers of titanium aluminum nitride and aluminum oxide, as well as a cover layer made of zirconium nitride. Such type of coating construction is known, for example, from US 2011/0268514 A1.

EP 1 717 346 A discloses cutting tools having a base body and an oxide coating applied via a PVD method, in which the oxide layer comprises at least two different oxides of the metals Ti, Nb, V, Mo, Zr, Cr, Al, Hf, Ta, Y, or Si, which may be present as a single phase or as a mixed oxide of two or more oxides of the aforementioned metals.

US 2010/183884 A describes the cutting tool having a base body and a coating applied to the base body via a PVD method, which comprises at least one layer made of a single-phase meta-stable and at least ternary oxide of elements of subgroups IV, V, VI of the periodic system, as well as of aluminum and silicon.

Compared to this prior art, the invention seeks to solve the problem of providing a simplified method for producing a cutting tool having a single-layer or multilayer coating comprising oxide-containing hard substances, in which the method additionally should enable the most flexible adjustment of the coating properties possible at a sufficient coating rate.

This problem is solved by a method with the features of claim 1.

Preferred embodiments are indicated in the dependent claims, which may be combined with one another as desired.

The subject matter of the invention is moreover a cutting tool obtainable via the method according to the invention as well as the use of the cutting tool for machining metals and metal alloys, particularly steel, cast iron, and special alloys based on nickel and/or titanium.

The method according to the invention for producing a coated cutting tool comprises the applying of a coating with at least one oxide layer to a base body by means of a PVD method, in which the method comprises the following steps:

voltage-pulsed sputtering of at least one cathode metal selected from the group consisting of magnesium, aluminum, scandium, yttrium, silicon, zinc, titanium, zirconium, hafnium, chromium, niobium, tantalum, as well as mixtures and alloys thereof in the presence of a reactive gas; and depositing of at least one oxide layer formed by converting the reactive gas with the sputtered cathode metal onto the base body, wherein the cathode metal comprises at least aluminum, wherein dinitrogen oxide, optionally in a mixture with nitrogen, is used as the reactive gas, and wherein the at least one oxide layer is formed in the form of an oxide, mixed oxide, or oxide mixture of the at least one cathode metal, optionally in a mixture with one or more oxynitrides of the cathode metal.

The subject matter of the invention is moreover a cutting tool having a base body and a coating with one or more oxide layers, which may be obtained according to the method described, as well as the use of the cutting tool coated in this manner for machining of metals and metal alloys, particularly of steel, cast iron, nickel alloys, and titanium alloys.

The use of dinitrogen oxide as the reactive gas enables the use of voltage-pulsed sputtering to produce oxidic hard layers under simplified conditions of the PVD method. On one hand, the handling of dinitrogen oxide is less demanding as compared to pure oxygen. While on the other hand, control of the operating point of the oxide depositing can be done via the cathode voltage or the substrate bias voltage in broader limits, because the populating of the targets with non-conducting metal oxides is significantly reduced. When producing multilayer coatings with alternating layers of oxide coatings and nitride coatings, the control of the operating point can even be completely omitted. Furthermore, cleaning of the targets is no longer required in this case before depositing of the nitride coatings, because the populating with oxides is negligible. Likewise, the inner surfaces of the coating chamber populated with an oxide layer no longer have to be covered with a conductive (nitride) coating in a conditioning process as is particularly required with the arc evaporation of oxides according to the prior art.

The base body is preferably selected from the group consisting of hard metal, cermet, cubic boron nitride, steel, and ceramics. Preferably, the base body is a sintered hard metal, particularly preferably a cobalt-bound tungsten carbide, optionally with the adding of additional cubic carbides such as titanium carbide, niobium carbide, and tantalum carbide.

The coating applied to the base body may comprise a base coating consisting of titanium aluminum nitride $Ti_{1-x}Al_xN$, preferably in a thickness of from 1 to 5 µm. The titanium aluminum nitride base coating improves the adhering of the other layers in the coating to the base body and additionally enhances the resistance of the coated cutting body to abrasive wear.

The titanium aluminum nitride base coating may be applied to the base body using known PVD methods. It is especially preferable when the titanium aluminum nitride base coating contains about 50 to 60 atomic % Al and 40 to 50 atomic % Ti in the metallic portion ($Ti_{1-x}Al_xN$ where $0.5 \leq x \leq 0.6$).

The oxide layer of the coating formed by the method according to the invention through the converting of dinitrogen oxide as a reactive gas with the sputtered cathode metal preferably comprises aluminum oxide. According to a particular embodiment, the oxide layer consists of aluminum oxide, optionally in a mixture with aluminum oxynitride. Aluminum oxide has a very high hardness level and a good resistance to high temperature and oxidation. According to the coating thickness, the aluminum oxide may also be used as the heat insulation coating. The formation of a portion of aluminum oxynitride in the oxide layer may be due to the use of dinitrogen oxide. An oxide layer consisting of aluminum oxide may therefore contain unavoidable portions of aluminum oxynitride due to on the conditions of the PVD method.

Preferably, the layer containing or consisting of aluminum oxide is applied to the base coating comprising titanium aluminum nitride. The coating thickness of the aluminum oxide coating is preferably in a range of from 1 to 6 µm.

According to an embodiment of the invention, the oxide layer, which is formed through conversion of the reactive gas (dinitrogen oxide) with the sputter cathode metal, of the coating may be formed from aluminum oxide and optionally portions of aluminum oxynitride, which is enriched with at least one additional cathode metal from the group consisting of Mg, Sc, Y, Si, Zn, Ti, Zr, Hf, Cr, Nb, and Ta as well as combinations thereof. The enrichment with Si, Ti, Zr, and Cr is particularly preferred. Due to the enrichment with one or more additional metals, the desired ratio between viscosity and hardness of the coating can be adjusted in a targeted manner by changing the tensions in the crystal lattice and the microstructure of the oxide layer.

Preferably, the portion of the at least one additional cathode metal is 1 to 30 atomic %, based on the total portion of cathode metals and the oxide layer, or preferably 2 to 10 atomic %.

The additional cathode metal may be present in the form of a single-phase mixed oxide with aluminum oxide in the oxide layer. So-called substitution mixed crystals then form in which individual lattice locations of aluminum in the aluminum oxide are replaced by other metal atoms. Mixed oxides of aluminum oxide and other metals are also characterized in the following as $AlMO_x$. Furthermore, it is assumed that the phrase "mixed oxides of aluminum oxide and other metals" also includes those mixed oxides containing a portion of oxydinitrides of aluminum and/or the other metals associated with the use of dinitrogen oxide as the reactive gas in the PVD process.

However, other mixtures of multiple oxide phases may also form an oxide layer in which aluminum oxide or an aluminum oxide $AlMO_x$ enriched with an additional cathode metal is present as the main component and a further oxide or mixed oxide is present as an auxiliary component in a lower portion, for example as an amorphous phase at the grain boundaries of the main component.

According to a preferred embodiment, the at least one oxide layer consists of mixed oxides of aluminum and chromium $AlCrO_x$, aluminum and silicon $AlSiO_x$, aluminum and titanium $AlTiO_x$, or aluminum and zirconium $AlZrO_x$, in which the atomic portions of aluminum and the other metal may vary and are preferably present in an Al:M range of =98:2 to 70:30. The metal portions may be controlled, for example, by selecting suitable targets and/or by the cathode voltage created at the targets.

It is preferable when the oxide layer with mixed oxides and/or oxide mixtures of aluminum and the at least one additional cathode metal is applied to the base layer comprising titanium aluminum nitride. The coating thickness of the oxide layer in this case preferably ranges from 0.1 to 10 μm, or preferably 0.1 to 6 μm, and especially preferably 0.5 to 3 μm.

The oxide layer comprising aluminum oxide or the aluminum oxide enriched with the at least one additional cathode metal may be formed as a single layer, i.e. it is the single oxide layer in the coating.

However, the coating may also comprise multiple oxide layers made of oxides of the sputtered cathode metal, optionally alternating with layers comprising one or more nitrides or carbon nitrides of metals Ti, Zr, Hf, Cr, Nb, and Ta. The nitride layers and/or carbon nitride layers may also be applied in the PVD process.

For a multilayer coating, the composition of the individual layers may essentially be equal.

According to a preferred embodiment, the multilayer coating consists of alternating layers of titanium aluminum nitride $Ti_{1-x}Al_xN$ and one oxide of the sputtered cathode metal. The titanium aluminum nitride preferably has a composition of $Ti_{1-x}Al_xN$ where $0.4 < x < 0.6$. The alternating layers of $Ti_{1-x}Al_xN$ and the cathode metal oxide may be applied directly onto the titanium aluminum nitride base layer or onto an intermediate layer comprising aluminum oxide or enriched aluminum oxide, which is deposited onto the base layer comprising $Ti_{1-x}Al_xN$. The oxide layers may consist of aluminum oxide $Al_2O_3$ or they may be formed from aluminum oxide that is enriched with at least one cathode metal selected from the group consisting of Mg, Sc, Y, Si, Zn, Ti, Zr, Hf, Cr, Nb, and Ta as well as combinations thereof.

According to a further embodiment, the composition of layers may also vary however. In particular, the oxide layers may have a gradient in relation to the aluminum content or the content of an additional metal. The aluminum content of the oxide layers may decrease from the base body in the direction of the outer layer and the content of an additional cathode metal may increase in the direction of the outer layer and vice versa.

According to a further embodiment, the composition of the oxide layers may vary in relation to the additional cathode metal. Thus, it is possible to apply one or more oxide layers in which the aluminum oxide is enriched, for example alternating with one of the metals Mg, Sc, Y, Si, Zn, Ti, Zr, Hf, Cr, Nb, or Ta, or preferably Si, Ti, Zr, or Cr.

In addition, the TiAlN coating between the oxide layers may have a gradient in relation to the aluminum portion, preferably an aluminum portion increasing from the base body in the direction of the outer coating of the coating. This may improve the adhesion of the oxide layers to the TiAlN coating. For a titanium aluminum nitride with the composition $Ti_{1-x}Al_xN$, x varies preferably from 0.4 to 0.6.

The thickness of the respective alternating layers is about 0.1 μm to 1 μm, or preferably from about 0.1 μm to 0.5 μm, and especially preferably from about 0.1 μm to 0.3 μm. The coating preferably has about 2 to 10 repetitions of nitride layer and oxide layer from the alternating layers. The total thickness of the coating from the alternating layers is preferably between 0.5 μm and 5 μm, or preferably between 1 and 2 μm.

The oxide layers containing the aluminum oxide enriched with at least one additional cathode metal may be obtained through voltage-pulsed sputtering while using one or more aluminum cathodes with portions of the additional cathode metal. Furthermore, an aluminum cathode may be used together with at least one other cathode comprising titanium, zirconium, hafnium, silicon, and/or chromium, mixtures and alloys thereof, as well as mixtures and alloys thereof with aluminum. In the PVD reactor, the sputtered cathode metals react with the dinitrogen oxide added as the reactive gas and are deposited onto the base body as oxides.

An inert gas, preferably argon, is typically used as the process gas to generate the plasma. The portion of dinitrogen oxide in the gas mixture is preferably from 5 to 10% by volume.

In one embodiment, the reactive gas may additionally contain nitrogen. Preferably, the nitrogen portion in the gas mixture is 5 to 10% by volume. The ratio between the dinitrogen oxide and the nitrogen varies preferably between 1:1 and 1:0.5. Higher portions of nitrogen are undesirable, because they may effect a reduction in the oxide depositing rate.

The depositing of oxide layers preferably takes place through pulsed medium-frequency sputtering at an alternating field frequency of preferably 10 to 100 kHz, or preferably 50 kHz. The electric alternating field ignites an argon plasma before the target and the cathode metal is atomized.

The cathode voltage is preferably in the range of from 380 to 430 V, with 400 to 420 V being particularly preferred.

It is preferable if two adjacently placed cathodes are bipolar-pulsed in the medium-frequency alternating field. The pulse frequency is preferably in the range of from 10 to 100 kHz, with 30 to 60 kHz being particularly preferred.

Preferably, processing is done with a substrate bias voltage of from −10 to −80 V, or especially preferably of from −40 to −60 V. Provided the non-electrically-conducting oxide layers are being deposited in a thin coating thickness of up to 0.5 μm, a medium-frequency excitation of the substrate bias can be omitted. Applying DC voltage to the substrate is then sufficient.

The substrate temperature is preferably from 500 to 700° C.

The processing pressure can range, for example, from 500 to 600 mPa, or preferably from 520 to 550 mPa.

The reactive gas flow is preferably in a range from 10 to 40 sccm, or especially preferably from 20 to 30 and can be controlled by maintaining a constant cathode voltage (so-called "operating point").

The coating can further have a cover layer as the outermost layer, the color of which differs from the color of the layer of coating under the cover layer. The cover layer in this case may be used as a marker in order to determine with the naked eye whether a cutting edge of the coated cutting insert has already been used. Through subsequent removal of the cover layer only on the cutting surface it is additionally possible to produce cutting tools with different properties on the respective surfaces, which may then also differ from one another in a visual inspection.

The cover layer may be formed, for example, in a yellow color comprising a nitride of titanium and/or zirconium. The cover layer comprising TiN and/or ZrN can also be produced in a PVD process.

According to a preferred embodiment, the cover layer is formed from aluminum oxide or an aluminum oxide enriched with an additional cathode metal. The coating thickness of the oxide cover layer is preferably from 0.1 to 0.5 μm. Depending on the coating thickness and degree of enrichment, the oxide cover layer may have an iridescent color tone or be in colors such as green, blue, or red.

Coatings with the following layer construction may be obtained, for example, with the method according to the invention:

Variant A)
Base layer: $Ti_{1-x}Al_xN$ where $0.4 \leq x \leq 0.6$ (1-6 μm)
Oxide layer: $Al_2O_3$ (0.5-6 μm)
Cover layer: $Ti_{1-x}Al_xN$, TiN or ZrN (0.1 to 1 μm)

Variant B)
Base layer: $Ti_{1-x}Al_xN$ where $0.4 \leq x \leq 0.6$ (1-6 μm)
Optional oxide intermediate layer: $Al_2O_3$ (0.5-6 μm)
Oxide layer: $Ti_{1-x}Al_xN$ and $Al_2O_3$
(0.1-0.5 μm each; alternating, up to 10 repetitions)
Cover layer: $Ti_{1-x}Al_xN$, TiN or ZrN (0.1 to 1 μm)

Variant C)
Base layer: $Ti_{1-x}Al_xN$ where $0.4 \leq x \leq 0.6$ (1-6 μm)
Oxide layer: $AlMO_x$ where M=Ti, Zr, Hf, Si, and/or chromium (0.5-6 μm)
Cover layer: $Ti_{1-x}Al_xN$, TiN and/or ZrN (0.1 to 1 μm)

Variant D)
Base layer: $Ti_{1-x}Al_xN$ where $0.4 \leq x \leq 0.6$ (1-6 μm)
Optional oxide intermediate layer: $AlMO_x$ where M=Ti, Zr, Hf, Si, and/or Cr (0.5-6 μm)
Oxide layer: $Ti_{1-x}Al_xN$ and $AlMO_x$ where M=Ti, Zr, Hf, Si, and/or Cr
(0.1-0.5 μm each; alternating, up to 10 repetitions)
Cover layer: $Ti_{1-x}Al_xN$, TiN or ZrN (0.1 to 2 μm)

Variant E)
Base layer: $Ti_{1-x}Al_xN$ where $0.4 \leq x \leq 0.6$ (1-6 μm)
Oxide layer: $Al_2O_3$ or $AlMO_x$ where M=Ti, Zr, Hf, Si, and/or Cr
(0.1 to 0.5 μm, and the cover layer)

In variants C) and D), the layers comprising $AlMO_x$ may preferably have a gradient in relation to the portion of Al and/or M. The atomic ratio between Al/M varies preferably between 98:2 and 70:30.

Furthermore, the cover layers in previous variants A) through D) may be replaced according to the invention with oxide cover layers comprising $Al_2O_3$ or $AlMO_x$, which are then applied to a layer comprising $Ti_{1-x}Al_xN$.

The coated cutting tools obtainable through the method according to the invention with at least one oxide layer, preferably an oxide layer comprising $AlMO_x$ where M=Ti, Zr, Hf, Si, and/or chromium, may preferably be used for machining metals and metal alloys, particularly steel, cast iron, nickel alloys, and titanium alloys. In comparison to conventional cutting tools with coatings comprising TiAlN, better cutting capacities with increased tool life can be achieved. In addition, the coating properties can be easily changed by changing the degree of enrichment, and thus it is easy to adapt to particular application conditions and customer wishes.

The use of dinitrogen oxide as the reactive gas enables the use of voltage-pulsed sputtering to produce oxidic hard layers under less demanding conditions. Thus, the operating point can be controlled to a great extent via the cathode voltage or the substrate bias voltage or, when producing multilayer coatings with alternating layers comprising oxide-containing coatings and nitride coatings, it can be completely omitted. Furthermore, cleaning of the targets is no longer required before depositing of the nitride coatings, because the populating with oxides can be prevented for the most part. The PVD method can thus be implemented under simpler conditions.

Additional features and advantages of the invention are presented in the following description of a preferred embodiment but should not be considered limiting.

EXAMPLE 1

In a CC800/9 sinox PVD coating system from Cemecon, a cutting tool comprising 12.2% by weight Co, 1.4% by weight TaC, 0.9% by weight NbC, and 85.5% by weight WC (P-types for milling steel) was provided with the following coating as indicated.

1. TiAlN (Ti:Al ratio of 40:60 at %) as a base coating with a coating thickness of 1.7 μm (deposited in DC voltage sputtering);
2. Aluminum oxide as an oxide layer with a coating thickness of 0.9 μm;
3. TiAlN as a cover layer with a coating thickness of about 0.1 μm;

Before the coating process, the hard metal base body was cleaned in the vacuum chamber with Ar ion bombardment.

The depositing of the TiAlN base coating was carried out in a known manner in DC voltage operation.

The depositing of the oxide layer and the TiAlN cover layer was implemented through pulsed medium-frequency sputtering. The deposit conditions are listed in Table 1 as follows:

TABLE 1

| PVD deposit conditions | | | |
|---|---|---|---|
| | TiAlN base coating | $Al_2O_3$ | TiAlN cover layer |
| Duration [s] | 5300 | 6000 | 500 |
| Substrate temperature [° C.] | 600 | 600 | 600 |
| Processing pressure [mPa] | 580 | 530 | 560 |
| Cathode pulse frequency [kHz] | 0 | 50 | 50 |
| Cathode voltage [V] | 370 | 390 | 330 |
| Bias voltage [−V] | 100 | 60 | 60 |
| Ar flow rate [sccm] | 500 | 500 | 500 |
| $N_2O$ flow rate [sccm] | 0 | 30 | 0 |
| $N_2$ flow rate [sccm] | 105 | 0 | 80 |

The coating was implemented using four cathodes, which were pulsed in bipolar operation. Two Al targets and two $Ti_{40}Al_{60}$ targets were used. The pulse frequency for both targets was about 50 kHz; the TiAl target, however, was operated only at low power in order to obtain pure aluminum oxide to the extent possible on the inserts on one hand and to prevent oxide population on the TiAl target surface on the other hand.

For depositing of aluminum oxide, dinitrogen oxide was used as the reactive gas in argon with a concentration of 6% by volume. The operating point was controlled by maintaining a constant cathode voltage of about 400 V.

EXAMPLE 2

To produce a cutting insert according to the prior art, a conventional PVD coating was applied to a hard metal base body according to Example 1. The coating consisted of TiAlN (Ti:Al ratio of 40:60 at %) with a coating thickness of 1.5 μm (deposited in DC voltage sputtering).

EXAMPLE 3

In a CC800/9 sinox PVD coating system from Cemecon, a cutting tool comprising 6.1% by weight Co and 83.9% by weight WC (K-types for cast milling cutters) was provided with the following coating as indicated.

1. TiAlN (Ti:Al ratio of 40:60 at %) as a base coating with a coating thickness of 3.1 μm (deposited in DC voltage sputtering);

2. Aluminum oxide as an oxide cover layer with a coating thickness of 0.1 μm;

The depositing of the oxide cover layer was achieved through pulsed medium-frequency sputtering similar to the conditions indicated in Table 1 but the coating duration was adapted.

EXAMPLE 4

To produce a cutting insert according to the prior art, a conventional PVD coating was applied to a hard metal base body according to Example 3. The coating consisted of TiAlN (Ti:Al ratio of 45:55 at %) with a coating thickness of 4.8 μm (deposited with DC voltage sputtering).

Cutting Test 1

In milling tests using an M680 corner milling tool on a workpiece made of alloyed 42CrMo4 steel, cutting tools having insert shape XPHT160412 according to Example 1 were used and compared to corresponding cutting tools according to Example 2.

Milling was done at a cutting speed vc of 250 m/min and a tooth feed rate fz of 0.25. The cutting depth ap was 1 mm and the cutting width ae was 20 mm. Milling was dry.

A higher milling length was achieved with the cutting tools from Example 1 produced according to the invention up to the end of useful life than was achieved with the comparison tools. The end of useful life is defined by reaching a wear mark width of 0.1 mm or breaking of the cutting edge.

With the tested cutting tools, the following milling lengths (average value of two milling tests in the so-called "single-tooth test") were achieved:

Example 1:
14400 mm (and 5330 mm per micrometer of coating thickness)

Example 2 (TiAlN coating according to prior art):
6400 mm (and 4270 mm per micrometer of coating thickness)

Cutting Test 2

In milling tests using an M680 corner milling tool on a workpiece made of GJS-700 ductile cast iron, cutting tools having insert shape XPHT160412 according to Example 3 were used and compared to corresponding cutting tools according to Example 4.

Milling was done at a cutting speed vc of 250 m/min and a tooth feed rate fz of 0.25. The cutting depth ap was 2 mm and the cutting width ae was 20 mm. Milling was dry.

A higher milling length was achieved with the cutting tools from Example 3 produced according to the invention up to the end of useful life than was achieved with the comparison tools. The end of useful life is defined by reaching a wear mark width of 0.2 mm or breaking of the cutting edge.

With the tested cutting tools, the following milling lengths (average value of two milling tests in the so-called "single-tooth test") were achieved:

Example 3:
8500 mm (and 2800 mm per micrometer of coating thickness)

Example 4 (TiAlN Coating According to Prior Art):
8250 mm (and 1700 mm per micrometer of coating thickness)

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A cutting tool with a base body and a coating, characterized in that the coating has one or more oxide layers wherein at least one oxide layer is produced according to the method comprising the steps of:
    voltage-pulsed sputtering of aluminum and at least one cathode metal selected from the group consisting of magnesium, aluminum, scandium, yttrium, silicon, zinc, titanium, zirconium, hafnium, chromium, niobium, tantalum, as well as mixtures and alloys thereof in the presence of a reactive gas; and
    depositing of at least one oxide layer formed by converting the reactive gas with the sputtered aluminum and cathode metal onto the base body,
    wherein dinitrogen oxide is used as the reactive gas, and
    wherein the at least one oxide layer is formed in the form of a mixed oxide of aluminum and the at least one cathode metal in a mixture with an oxynitride of the cathode metal, aluminum or a combination thereof.

2. The cutting tool according to claim 1, characterized in that a base coating comprising titanium aluminum nitride is applied directly to the base body.

3. The cutting tool according to claim 2, wherein the base coating contains 50 to 60 atomic % aluminum.

4. The cutting tool according to claim 1, characterized in that the at least one oxide layer comprises aluminum oxidynitride enriched with portions of the at least one cathode metal.

5. The cutting tool according to claim 1, characterized in that the coating further comprises multiple oxide layers.

6. The cutting tool of claim 5, wherein the multiple oxide layers alternate with one or more nitrides or carbon nitrides of the metals Ti, Zr, Hf, Cr, Nb, and Ta, or with titanium aluminum nitride.

7. The cutting tool according to claim 5, characterized in that the multiple oxide layers have a gradient with an aluminum content decreasing from the base body in the direction of the outermost oxide layer.

8. The cutting tool according to claim 1, characterized in that the coating has a cover layer formed from the oxide layer.

9. The cutting tool according to claim 8, characterized in that the cover layer has a coating thickness ranging from about 0.1 to about 0.5 μm.

10. The cutting tool according to claim 9, characterized in that the coating consists of a titanium aluminum nitride layer applied directly to the base body and the cover layer formed from the oxide layer.

11. The cutting tool according claim 1, wherein the at least one cathode metal is silicon.

12. The cutting tool according to claim 1, wherein the at least one cathode metal is titanium.

13. The cutting tool according to claim 1, wherein the at least one cathode metal is zirconium.

14. The cutting tool according to claim 1, wherein the at least one cathode metal is chromium.

15. The cutting tool according to claim 1, wherein the aluminum and at least one cathode metal are present in the oxide layer at a ratio (Al:M) ranging 98:2 to 70:30.

16. The cutting tool of claim 4, wherein the aluminum oxynitride is enriched with portions of at least one other cathode metal selected from the group of consisting of Mg, Sc, Y, Si, Zn, Ti, Zr, Hf, Cr, Nb, and Ta, as well as combinations thereof.

17. A cutting tool with a base body and a coating, characterized in that the coating has one or more oxide layers wherein at least one oxide layer is produced according to the method comprising the steps of:
- voltage-pulsed sputtering of at least one cathode metal selected from the group consisting of magnesium, aluminum, scandium, yttrium, silicon, zinc, titanium, zirconium, hafnium, chromium, niobium, tantalum, as well as mixtures and alloys thereof in the presence of a reactive gas; and
- depositing of at least one oxide layer formed by converting the reactive gas with the sputtered cathode metal onto the base body,
- wherein the cathode metal comprises at least aluminum,
- wherein dinitrogen oxide is used as the reactive gas, and
- wherein the at least one oxide layer is formed in the form of an oxide or oxide mixture of the at least one cathode metal in a mixture with one or more oxynitrides of the cathode metal.

18. The method of claim 17, wherein the cathode metal further comprises silicon.

19. The method of claim 17, wherein the cathode metal further comprises titanium.

20. The method of claim 17, wherein the cathode metal further comprises chromium.

21. The method of claim 17, wherein the cathode metal further comprises zirconium.

* * * * *